(12) United States Patent
Odnoblyudov et al.

(10) Patent No.: US 12,191,286 B2
(45) Date of Patent: *Jan. 7, 2025

(54) CHIP-ON-BOARD DESIGN WITH COLOR MIXING

(71) Applicant: Bridgelux, Inc., Fremont, CA (US)

(72) Inventors: Vladimir Odnoblyudov, Danville, CA (US); Cem Basceri, Los Gatos, CA (US); Peng Chen, Dublin, CA (US)

(73) Assignee: BRIDGELUX, INC., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/174,458

(22) Filed: Feb. 24, 2023

(65) Prior Publication Data

US 2023/0335538 A1  Oct. 19, 2023

Related U.S. Application Data

(63) Continuation of application No. 17/074,324, filed on Oct. 19, 2020, now Pat. No. 11,600,604, which is a continuation of application No. 16/549,147, filed on Aug. 23, 2019, now Pat. No. 10,811,397, which is a continuation of application No. 15/072,304, filed on Mar. 16, 2016, now Pat. No. 10,403,607.

(60) Provisional application No. 62/133,907, filed on Mar. 16, 2015.

(51) Int. Cl.
*H01L 25/075* (2006.01)
*F21K 9/23* (2016.01)
*F21L 4/02* (2006.01)
*F21W 131/103* (2006.01)
*F21Y 115/10* (2016.01)

(52) U.S. Cl.
CPC ............ *H01L 25/0753* (2013.01); *F21K 9/23* (2016.08); *F21L 4/027* (2013.01); *F21W 2131/103* (2013.01); *F21Y 2115/10* (2016.08)

(58) Field of Classification Search
CPC .... H01L 25/0753; F21K 9/23; F21Y 2115/10; F21L 4/027; F21W 2131/103
See application file for complete search history.

(56) References Cited

U.S. PATENT DOCUMENTS

| | | |
|---|---|---|
| 2006/0022999 A1 | 2/2006 | Lee et al. |
| 2006/0072319 A1 | 4/2006 | Dziekan et al. |
| 2008/0225523 A1 | 9/2008 | De Samber et al. |
| 2010/0127282 A1 | 5/2010 | Harbers et al. |
| 2011/0180804 A1 | 7/2011 | Su |
| 2011/0222264 A1 | 9/2011 | Matsuda et al. |
| 2012/0138978 A1 | 6/2012 | Tsang |
| 2012/0187865 A1* | 7/2012 | Chung .................. H05B 45/46 315/294 |
| 2013/0113003 A1 | 5/2013 | Ke et al. |
| 2013/0249407 A1* | 9/2013 | Kashiwagi ............ H05B 45/22 315/250 |

(Continued)

*Primary Examiner* — Laura A Gudorf
(74) *Attorney, Agent, or Firm* — ARENTFOX SCHIFF LLP

(57) ABSTRACT

Some embodiments of the disclosure provide for a lighting system including a substrate. The lighting system includes several blue light emitting diodes (LEDs) supported by the substrate. The lighting system includes at least one red LED supported by the substrate. The lighting system includes a light conversion material covering the blue LEDs and the at least one red LED.

6 Claims, 8 Drawing Sheets

(56) References Cited

U.S. PATENT DOCUMENTS

| | | |
|---|---|---|
| 2013/0328074 A1 | 12/2013 | Lowes et al. |
| 2014/0231834 A1 | 8/2014 | Lowenthal et al. |
| 2015/0060901 A1 | 3/2015 | Kondo |
| 2016/0066384 A1 | 3/2016 | Dias et al. |

* cited by examiner

CHIP-ON-BOARD DESIGN WITH COLOR MIXING

CROSS-REFERENCE TO RELATED APPLICATIONS

This application is a continuation of U.S. patent application Ser. No. 17/074,324, filed Oct. 19, 2020, which is a continuation of U.S. patent application Ser. No. 16/549,147, filed Aug. 23, 2019, now U.S. Pat. No. 10,811,397, Oct. 20, 2020, which is a continuation of U.S. patent application Ser. No. 15/072,304, filed Mar. 16, 2016, now U.S. Pat. No. 10,403,607, Sep. 3, 2019, which claims priority to U.S. Provisional Patent Application No. 62/133,907, filed Mar. 16, 2015, the contents of each of which are hereby fully incorporated by reference in their entirety.

BACKGROUND OF THE INVENTION

Field of the Invention

The present invention generally relates to chip-on-board (COB) light emitting diode (LED) architectures and more particularly to COB LED architectures that incorporate both red and blue LEDs.

Background

Current LED Chip-On-Board (COBs) architectures generate white light through the combination of blue LEDs and phosphors. To achieve warm white light, red phosphors are usually added to convert part of the blue light emitted from blue LED into red light. However, the quantum conversion efficiency of red phosphors is usually low and the cost of red phosphors is high.

Therefore, what is needed is a lighting system that generates the red part of the warm white light that is more cost effective and more efficient than using red phosphors to generate the red part of warm white light.

SUMMARY OF THE INVENTION

Accordingly, embodiments are directed to a lighting system that can be used to generate the red part of the warm white light in a more cost effective and more efficient way than is done when using red phosphors to generate the red part of warm white light. According to some embodiments both red and blue LEDs are integrated into a COB lighting package to produce light at high quantum conversion efficiency and at low cost.

Some embodiments of the disclosure provide a lighting system includes several blue LEDs supported by the substrate. The lighting system includes at least one red LED supported by the substrate. The lighting system includes a light conversion material covering the plurality of blue LEDs and the at least one red LED.

Another embodiment of the disclosure includes a lighting system including a substrate. The lighting system includes several blue LEDs supported by the substrate. The lighting system includes at least one red LED supported by the substrate. The lighting system includes a light conversion material covering the blue LEDs.

Another embodiment includes a lighting system including several blue LEDs, each fabricated on corresponding one of a plurality of first substrates. The lighting system includes a red LED fabricated on a second substrate. The lighting system includes a common substrate supporting the plurality of blue LEDs and the red LED. The lighting system includes a light conversion material covering the plurality of blue LEDs and the red LED.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
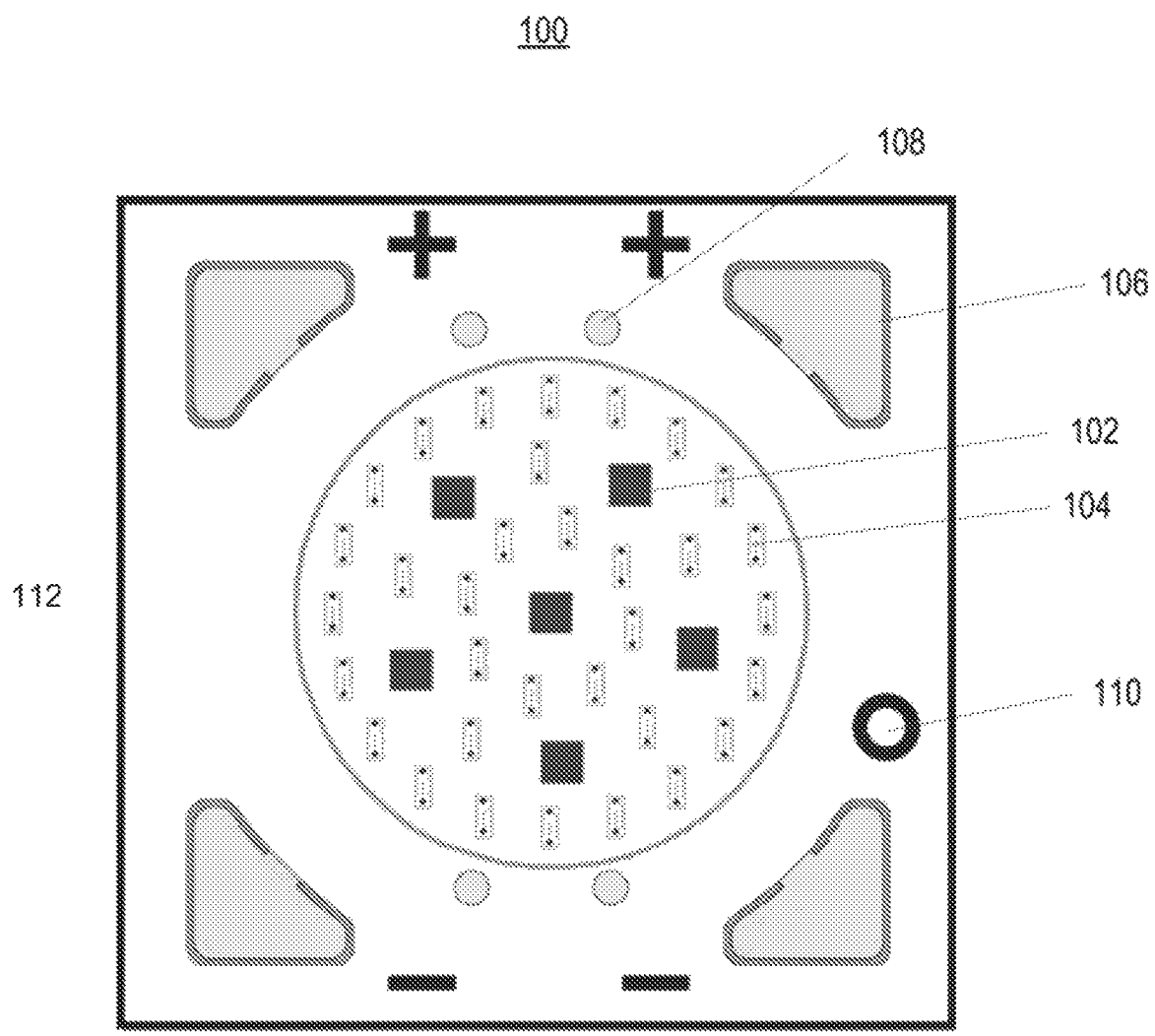
FIG. 1 illustrates a first exemplary COB design incorporating blue and red LEDs.

Various aspects of the invention will be described herein with reference to drawings that are schematic illustrations of idealized configurations of the present invention. As such, variations from the shapes of the illustrations resulting from manufacturing techniques, tolerances, etc., are to be expected. Thus, the various aspects of the invention presented throughout this disclosure should not be construed as limited to the particular shapes of elements (e.g., regions, layers, sections, substrates, etc.) illustrated and described herein, but are to include deviations in shapes that result, for example, from manufacturing. By way of example, an element illustrated or described as a rectangle may have rounded or curved features and/or a gradient concentration at its edges rather than a discrete change from one element to another.

Furthermore, relative terms, such as "lower" or "bottom" and "upper" or "top," may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements disclosed as being on the "lower" side of other elements would then be oriented on the "upper" side of the other elements. The term "lower" can therefore encompass both an orientation of "lower" and "upper," depending on the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Various disclosed aspects may be illustrated with reference to one or more exemplary configurations. As used herein, the term "exemplary" means "serving as an example, instance, or illustration," and should not necessarily be construed as preferred or advantageous over other configurations disclosed herein.

Furthermore, various descriptive terms used herein, such as "on" and "transparent," should be given the broadest meaning possible within the context of the present disclosure. It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. In addition, something that is described as being "transparent" should be understood as having a property that allows no significant obstruction or absorption of electromagnetic radiation in the particular wavelength (or wavelengths) of interest, unless a particular transmittance is provided. It will be further understood that when an element is referred to as being "formed" on another element, it can be grown, deposited, etched, attached, connected, coupled, or otherwise prepared or fabricated on the other element or an intervening element.

The following description relates to a lighting system that utilizes a common substrate to support both red and blue LEDs. The red and blue LEDs are covered by a same phosphor. Such a configuration provides warm white light output at a lower cost.

FIG. 1 illustrates a first exemplary COB design 100 incorporating blue and red LEDs. The first COB design 100 includes red LEDs 102 (6 shown), blue LEDs 104 (33 shown), contact pads 106 (4 shown), fiducials 108, (4 shown) test contact 110, and a substrate 112. The COB design 100 may also include a phosphor cover over the LEDs, which is not shown in this illustration for simplicity. The red LEDs 102 and/or the blue LEDs 104 may be formed on a transparent substrate. Such transparent substrates may be made of silicon or sapphire.

The red LEDs 102 are surrounded by the blue LEDs 104. The substrate 112 supports the red LEDs 102 and the blue LEDs 104. In some embodiments of the COB, the substrate 112 is a flexible substrate. The blue LEDs 104 are covered with phosphor. In some embodiments the red LEDs 102 are not covered with phosphor whereas in other embodiments the red LEDs 102 are covered with the same phosphor as the phosphor used to cover the blue LEDs 104. The contact pads 106 are used to make electrical contact with the COB design 100 and to provide electrical power to the COB design 100. The fiducials 108 are used to position and place the LEDs and other structures on a substrate. The test contact 110 is used to measure properties, such as temperature, of the COB design 100.

As will be shown in the foregoing, the blue LEDs 104 may be electrically coupled to the red LEDs. At least one of the red LEDs and the blue LEDs may be connected in series to form a string of LEDs. Several strings of LEDs may be electrically parallel. All of the parallel strings of LEDs may be supported by a common substrate. Additionally all of the strings may be covered by the same phosphor. However, in some embodiments of the COB, the blue LEDs 104 may be covered by the phosphor, while the red LEDs are not covered by phosphor.

As those of ordinary skill in the art will appreciate, red LEDs typically have a voltage drop of around 1.8V (e.g., between 1.7V and 1.9V) and blue LEDs typically have a voltage drop of around 3.4V (e.g., between 3.0V and 3.8V). Thus, when the red LEDs 102 and the blue LEDs 104 are connected in series, the efficacy (lumens/watt) of the COB design is impacted due to the difference in voltage drops between the red LEDs 102 and the blue LEDs 104. For instance, the red LEDs 102 have a lower resistance than the blue LEDs 102. In such instances, when a fixed voltage, such as 3.4V, is applied to several series connected LEDs, the more red LEDs that are in the series connection, the higher the current that is applied to the LEDs. As such, the red LEDs could burn out at a faster rate due to energy inefficiency. For instance, FIG. 2 illustrates how the efficacy of the COB design 100 can be impacted by the number of series connected red LEDs.

Figure 2:
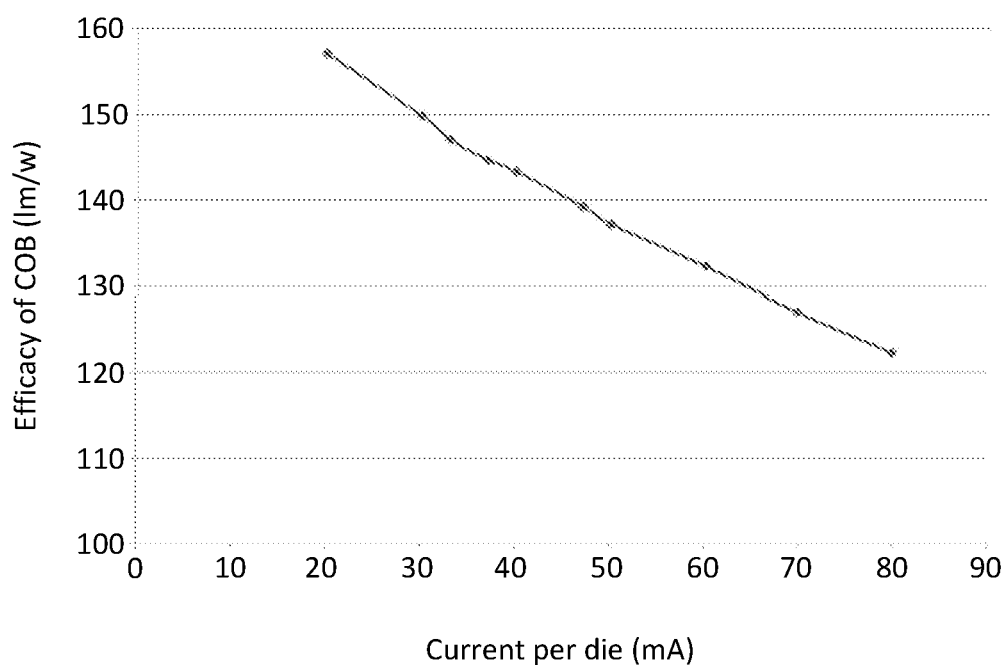
FIG. 2 is a plot showing the efficacy (lumens/watt) of the first exemplary COB design as a function of current per die (milliamps).
Figure 3A:
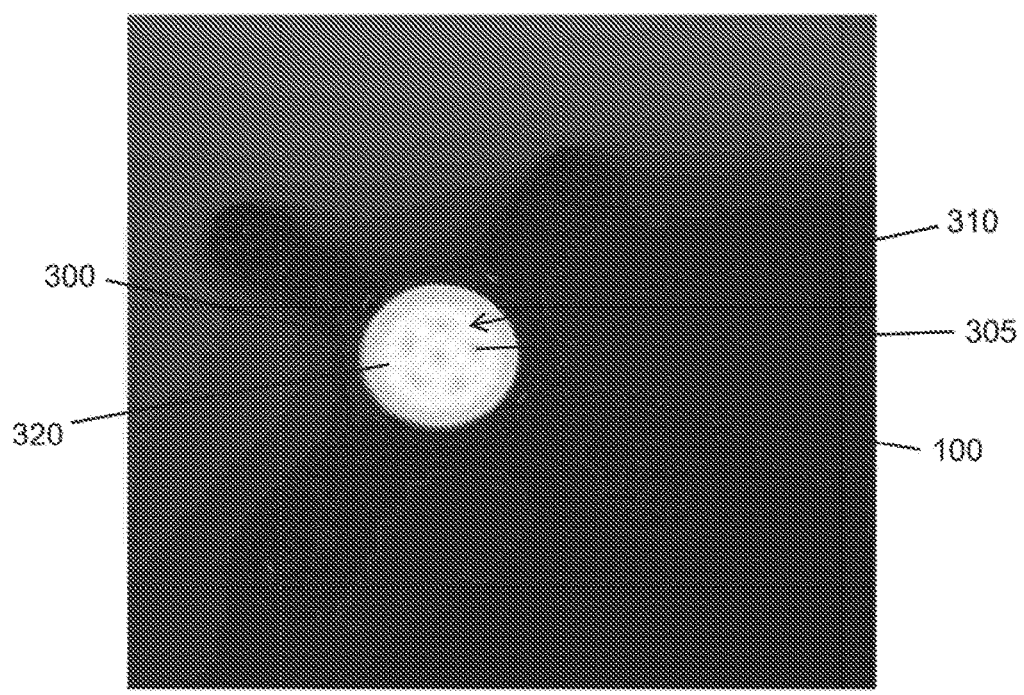
FIG. 3A illustrates the light output of a lighting system including first exemplary COB design when it is being powered with 0.1 mA.

FIG. 2 is a plot 200 showing the efficacy of the first exemplary COB design 100 as a function of current per die (milliamps). As shown, the efficacy of the first COB design 100 decreases as the current per die increases from 20 milliamps to 80 milliamps. Assuming that a fixed voltage is applied to the LEDs in a string, when more red LEDs are electrically coupled electrically coupled along the string of LEDs, the current increases. This is because the resistance is inversely related to current. It also follows that at higher voltages, efficacy would also drop because voltage is directly related to current. Thus, high voltage can also overdrive the red LEDs causing premature burnout. Thus, the plot 200 may be utilized to help determine the number of red LEDs that may be included in a string of LEDs based on a desired efficacy. However, other current considerations may also be taken into account with respect to the first COB design 100. For instance, if not enough current is applied to the COB 100, dark spots, caused by the red LEDs, may appear. FIG. 3A illustrates such dark spots.

FIG. 3A illustrates the light output of a lighting system 300 including first exemplary COB design 100 when it is being powered with 0.1 mA. The light emitting apparatus COB design 100 includes color spots 305, a substrate 320 supporting the LEDs of the COB design, and a phosphor 310. The phosphor 310 covers the LEDs supported by the substrate 320. As discussed with respect to FIG. 1, the COB design 100 includes both red and blue LEDs. As shown, when the first COB design 100 is driven at 0.1 mA the output brightness is low enough that the color spots 305 are visible. Such color spots 305 may be the red LEDs. For instance, if not enough current powers the lighting system 300 the red LEDs may be visible because the overall output brightness of the COB 100 is too low.

Figure 3B:
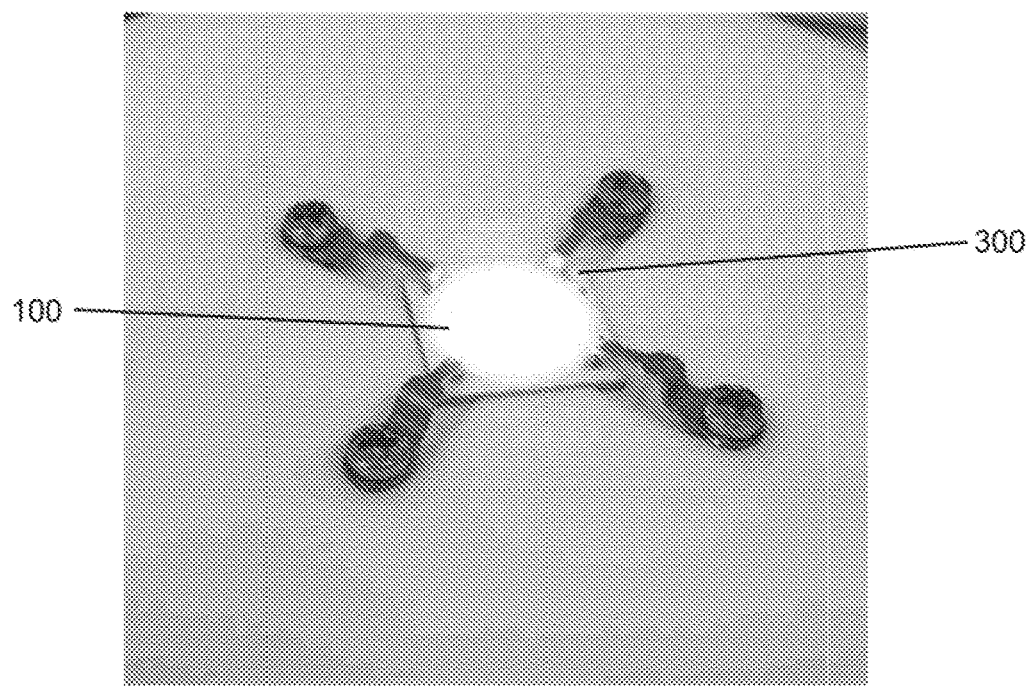
FIG. 3B illustrates the light output of the lighting system including the first exemplary COB design when it is being powered with 1.0 mA.

FIG. 3B illustrates the light output of the lighting system 300 including the first exemplary COB design 100 when it is being powered with 1.0 mA. When the first COB design 100 is driven at 1.0 mA the output brightness is already high enough that color spots 305 are no longer visible, as they were when the first COB design 100 was being driven at 0.1 mA, as illustrated in FIG. 3A. Thus, the driving current of the lighting system may be between 0.1 mA and 1.0 mA to achieve the desired brightness for the warm white light, without visible color spots. The driving current could be above 1.0 mA. However, if the driving current is too high, efficacy may be reduced because the LEDs may burn out faster.

Figure 4A:
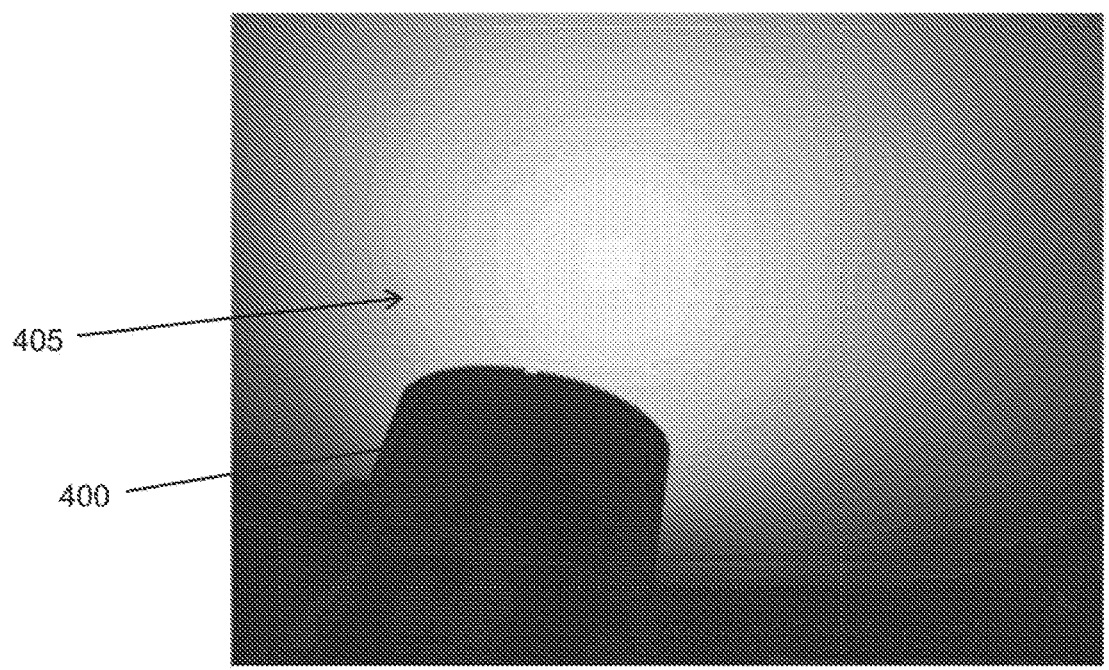
FIG. 4A illustrates the light output of a lighting system using only blue LEDs and phosphor to generate white light.
Figure 4B:
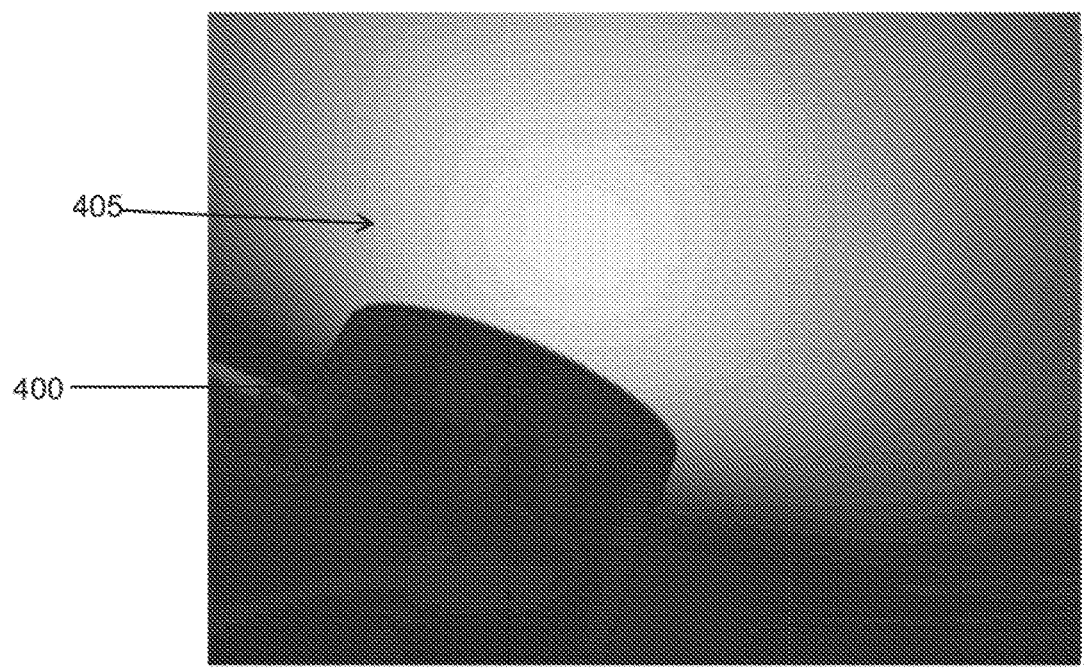
FIG. 4B illustrates light output of the first exemplary COB design light source, which uses both red and blue LEDs along with phosphor to generate white light.

FIG. 4A illustrates the light output of a lighting system 400 using only blue LEDs and phosphor to generate white light. FIG. 4B illustrates the light output of the lighting system 400 using first COB design 100, which uses both red and blue LEDs along with phosphor to generate white light. As shown, the brightness of the lighting system 400 is higher when the first COB design 100 is used. Thus, the inclusion a combination of red and blue LEDs in a lighting system may deliver higher brightness than previous lighting systems utilizing only blue LEDs.

Figure 5:
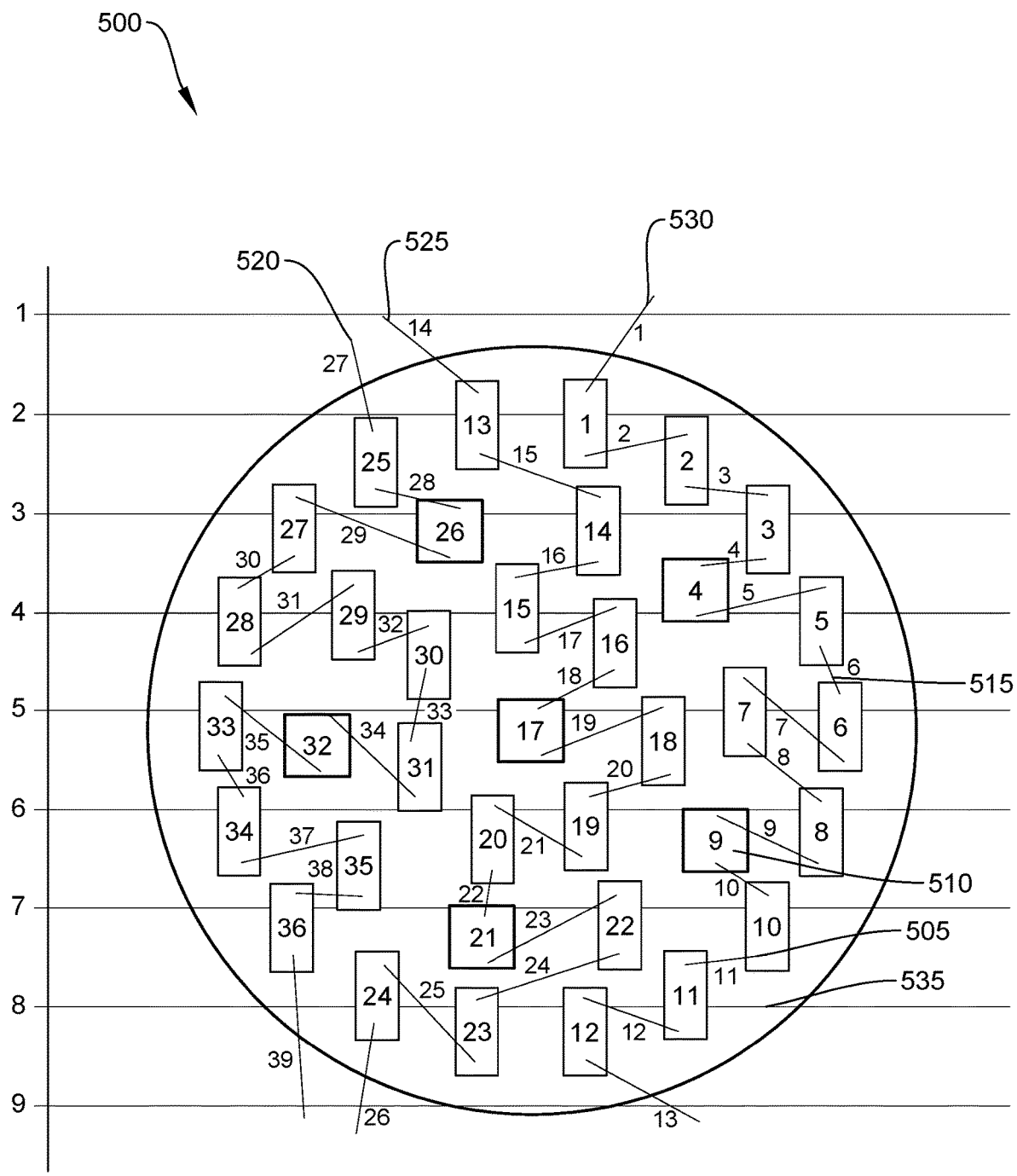
FIG. 5 illustrates a second exemplary COB design incorporating blue and red LEDs.

FIG. 5 illustrates a exemplary second COB design 500 incorporating blue and red LEDs. The second COB design 500 includes red LEDs 510 (6 shown) and blue LEDs 505 (30 shown), conductors 515, a substrate 535, and LED strings 520-530. Although not shown, the second COB design 500 may also include contact pads, fiducials, and test contacts which operate substantially the same as discussed with reference to FIG. 1.

As with first COB design 100, in the second COB design 500 the red LEDs 510 are surrounded by the blue LEDs 505. The blue LEDs 505 and the red LEDs 510 are supported by the substrate 535. In some embodiments of the COB, the substrate 535 is a flexible substrate. The blue LEDs 505 may be covered with phosphor. In some embodiments, the red LEDs 510 are not covered with phosphor whereas in other embodiments the red LEDs 510 are covered with the same phosphor as the phosphor used to cover the blue LEDs 505. As discussed above with reference to FIG. 1, the LEDs may be electrically coupled, in series, to form a string of LEDs such as the strings 520-530. A string of LEDs, such as one of the strings 520-530 may include several blue LEDs 505 and at least one red LED 505. Each LED in the string of LEDs may be coupled by a conductor 515. Such conductors may be a wire or trace. As shown by the string 530, for example, the LEDs numbered 1-12 may form the string 530. LEDs 13-24 form the string 525 and LEDs 25-36 form the string 520. As shown, the string 530 includes 2 red LEDs (LEDs 4 and 9) and 10 blue LEDs (LEDs 1-3, 5-8, and 10-12). In this example the COB design 500 includes 3 strings of LEDs, string 520, 525, and 530, which may be in an electrically parallel configuration.

In some embodiments of the COB designs 500 and 100, all of the LEDs in the design are connected to a single driver. Alternatively, a first driver may power the blue LEDs 505 and a second driver may power the red LEDs 510. As such, the red LEDs may be driven at a lower voltage so that they avoid early burn out.

Figure 6:
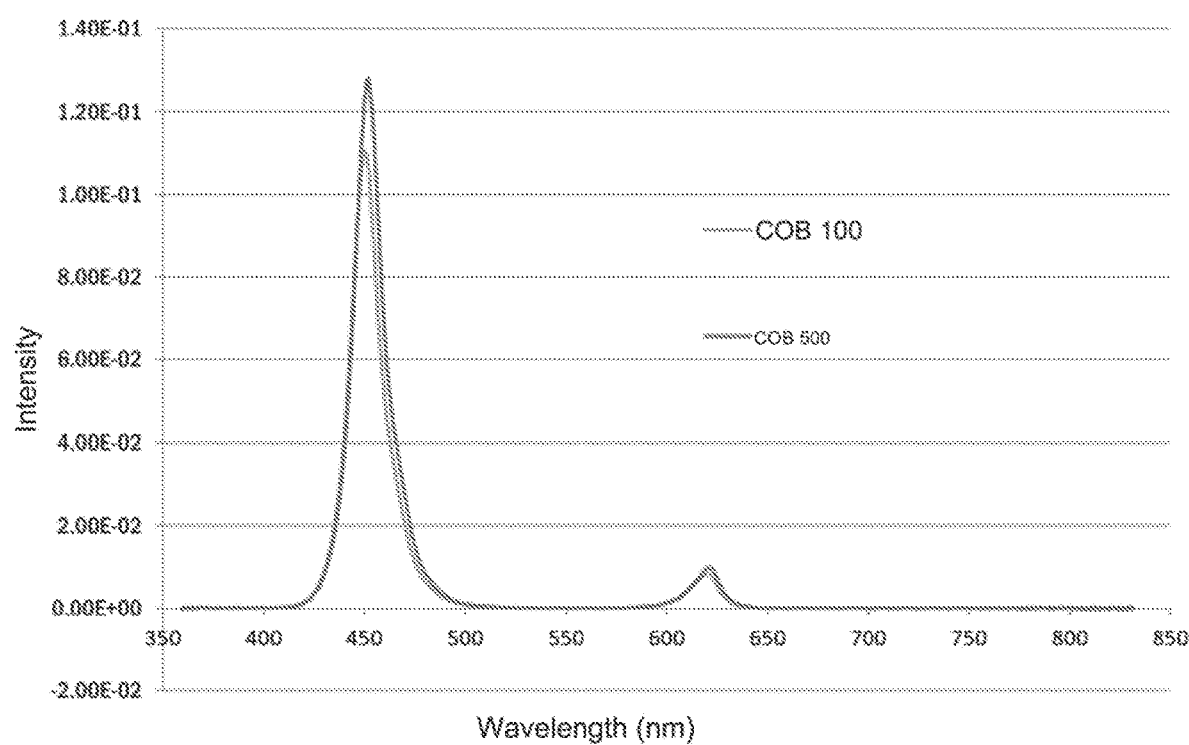
FIG. 6 is a plot showing color intensity for light emitted by the first exemplary COB design of FIG. 1 and the second exemplary COB design of FIG. 5 without a phosphor cover.

FIG. 6 is a plot showing color intensity for light emitted by the first exemplary COB design 100 of FIG. 1 and the second exemplary COB design 500 of FIG. 5 without a phosphor cover. As shown by the first curve of the plot, blue light (at 450 nm) has the highest intensity for both COB design 100 and COB design 500. Additionally, some red light is emitted (at 620 nm), but at a much lower intensity compared to the blue light.

Figure 7:
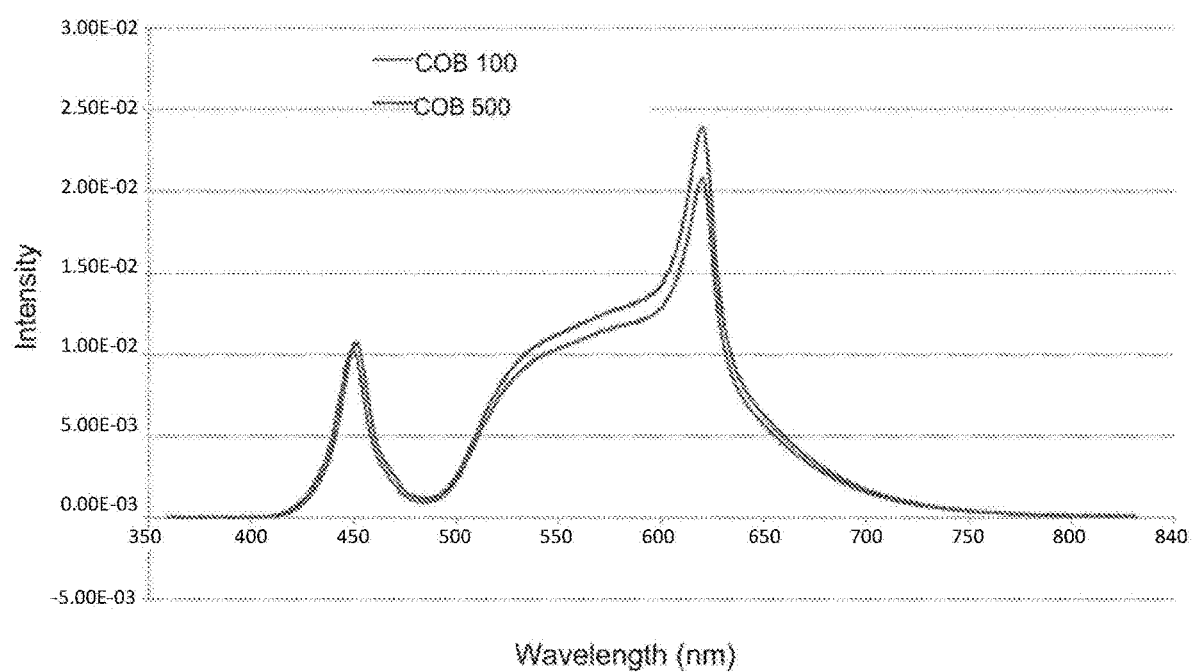
FIG. 7 is a plot showing color intensity for light emitted by the first exemplary COB design of FIG. 1 and the second exemplary COB design of FIG. 5 with a phosphor cover.

FIG. 7 is a plot showing color intensity for light emitted by the first exemplary COB design 100 of FIG. 1 and the second exemplary COB design 500 of FIG. 5 with a phosphor cover. As shown, the intensity of blue light is reduced from the intensity shown in FIG. 6 because the phosphor absorbs some of the blue light and fluoresces white light. Additionally, a broader spectrum of colors is emitted through the phosphor layer, including the red light, which passes through the phosphor layer with minimal absorption. Thus, warm white light can be realized from either COB design 100 and COB design 500. Additionally, similar designs incorporating red and blue LEDs on a common substrate may be utilized to provide warm white light without departing from the scope of the disclosure. For instance, the number of red and blue LEDs could be varied so long as the efficacy, as discussed above with reference to FIG. 2 is within a particular tolerance.

Table 1 is a data table showing properties of the first COB design 100 with phosphor and the second COB design 500 with phosphor.

TABLE 1

|  | CCT/K | CRI | Efficacy (lm/w) |
| --- | --- | --- | --- |
| COB design 100 | 3000 | 80 | 140 |
| COB design 500 | 3000 | 80 | 143 |

The first COB design 100 has correlated color temperature (CCT) of 3000 kelvin (K), a color rendering index (CRI) of 80, and an efficacy of 140 lumens/watt. The second COB design 500 has correlated color temperature (CCT) of 3000 kelvin (K), a color rendering index (CRI) of 80, and an efficacy of 143 lumens/watt. The efficacy may fluctuate with the amount of voltage applied to the COB design. For instance, the voltage applied to either COB design 100 or COB design 500 may vary based on the tolerance of the LEDs and the power supply. Thus, the efficacy can vary according to the materials used in the design as well as particular tolerances associated with such materials. For instance, the COB design 500 may have a higher efficacy than the COB design 100 if the voltage applied to the COB design 500 is adjusted to compensate for the fewer blue LEDs in the design.

Figure 8A:
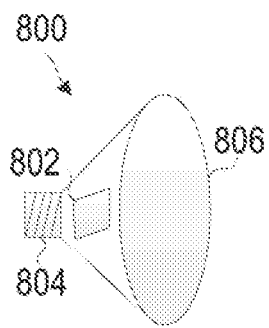
FIGS. 8A-8C are side view illustrations of various exemplary apparatuses using the COB design.

FIG. 8A is a side view illustration of an exemplary apparatus 800 having a lighting system 802 utilizing the COB design. The lighting system 802 may be located in a housing 806. The lighting system 802 may receive power via a power connection 804. The lighting system 802 may be configured to emit light. Description pertaining to the process by which light is emitted by the lighting system 802 is provided with reference to FIGS. 1-7.

Figure 8B:
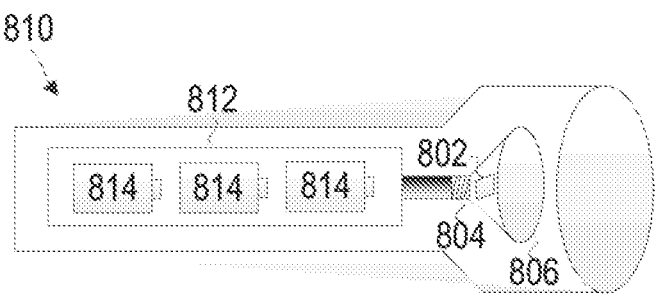

FIG. 8B is a side view illustration of a flashlight 810, which is an exemplary embodiment of an apparatus having the lighting system 802. The lighting system 802 may be located inside of the housing 806. The flashlight 810 may include a power source. In some exemplary embodiments, the power source may include batteries 814 located inside of a battery enclosure 812. The power connection 804 may transfer power from the power source (e.g., the batteries 814) to the lighting system 802.

Figure 8C:
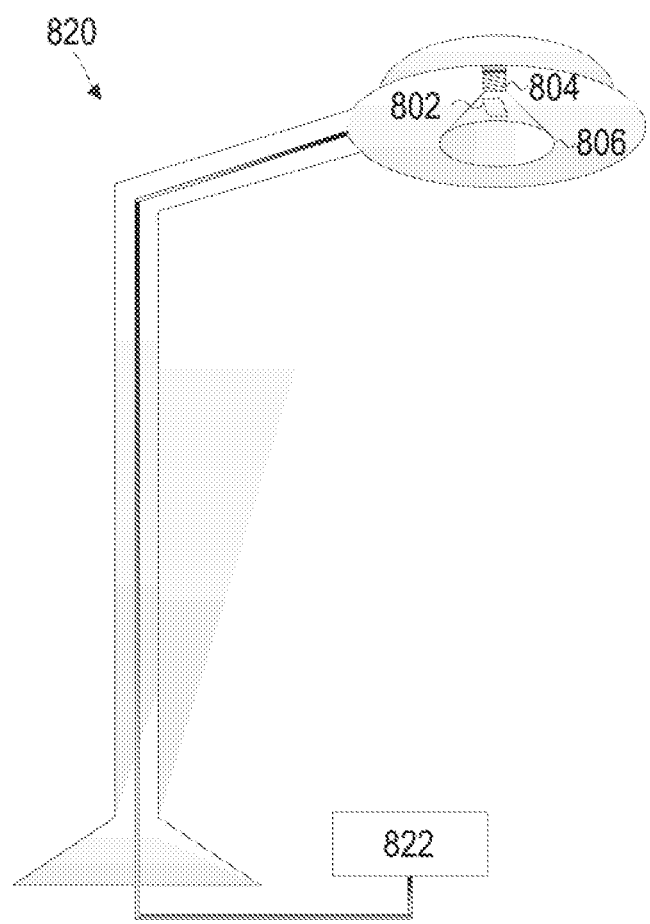

FIG. 8C is a side view illustration of a street light 820, which is another exemplary embodiment of an apparatus having the lighting system 802. The lighting system 802 may be located inside of the housing 806. The street light 820 may include a power source. In some exemplary embodiments, the power source may include a power generator 822. The power connection 804 may transfer power from the power source (e.g., the power generator 822) to the lighting system 802.

The inventions and methods described herein can be viewed as a whole, or as a number of separate inventions that can be used independently or mixed and matched as desired. All inventions, steps, processes, devices, and methods described herein can be mixed and matched as desired. All previously described features, functions, or inventions described herein or by reference may be mixed and matched as desired.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A lighting system, comprising:
   a substrate;
   a first string of light emitting diodes (LEDs) comprising a plurality of blue light emitting diodes (LEDs) supported by the substrate and at least one red LED supported by the substrate, wherein the at least one red LED is surrounded by the plurality of blue LEDs;
   a second string of LEDs electrically parallel to the first string of LEDs, wherein the second string of LEDs comprises a plurality of blue LEDs and at least one red LED; and
   a light conversion material covering the plurality of blue LEDs and the at least one red LED on the first string.

2. The lighting system of claim 1, wherein the second string of LEDs is supported by the substrate and covered by the light conversion material.

3. The lighting system of claim 1, wherein a current applied to the first string of LEDs is greater than 0.1 mA.

4. The lighting system of claim 1, wherein a current applied to the first string of LEDs is greater than 0.1 mA and less than or equal to 1 mA.

5. The lighting system of claim 1, wherein a number of the red LEDs in the first string of LEDs is associated within an efficacy tolerance.

6. The lighting system of claim 1, wherein the plurality of blue LEDs are driven by a first driver and the at least one red LED is driven by a second driver.

* * * * *